United States Patent
Nakayama et al.

(10) Patent No.: US 9,269,890 B2
(45) Date of Patent: Feb. 23, 2016

(54) MAGNETORESISTANCE EFFECT ELEMENT WITH SHIFT CANCELING LAYER HAVING PATTERN AREA GREATER THAN THAT OF STORAGE LAYER

(71) Applicants: Masahiko Nakayama, Shimonoseki (JP); Toshihiko Nagase, Tokyo (JP); Tadashi Kai, Tokyo (JP); Youngmin Eeh, Kawagoe (JP); Koji Ueda, Fukuoka (JP); Yutaka Hashimoto, Kimitsu (JP); Daisuke Watanabe, Kai (JP); Kazuya Sawada, Morioka (JP)

(72) Inventors: Masahiko Nakayama, Shimonoseki (JP); Toshihiko Nagase, Tokyo (JP); Tadashi Kai, Tokyo (JP); Youngmin Eeh, Kawagoe (JP); Koji Ueda, Fukuoka (JP); Yutaka Hashimoto, Kimitsu (JP); Daisuke Watanabe, Kai (JP); Kazuya Sawada, Morioka (JP)

(*) Notice: Subject to any disclaimer, the term of this patent is extended or adjusted under 35 U.S.C. 154(b) by 0 days.

(21) Appl. No.: 14/014,210

(22) Filed: Aug. 29, 2013

(65) Prior Publication Data

US 2014/0284735 A1 Sep. 25, 2014

Related U.S. Application Data

(60) Provisional application No. 61/804,407, filed on Mar. 22, 2013.

(51) Int. Cl.
*H01L 29/82* (2006.01)
*H01L 43/08* (2006.01)
*H01F 10/32* (2006.01)
*H01F 41/32* (2006.01)

(52) U.S. Cl.
CPC ............ *H01L 43/08* (2013.01); *H01F 10/3254* (2013.01); *H01F 10/3259* (2013.01); *H01F 41/325* (2013.01)

(58) Field of Classification Search
CPC ....... H01L 27/28; H01L 27/228; H01L 43/08; H01L 43/10; H01L 43/12
USPC ........................ 257/421, 425; 438/3; 365/158
See application file for complete search history.

(56) References Cited

U.S. PATENT DOCUMENTS

| | | | |
|---|---|---|---|
| 2012/0069640 A1 | 3/2012 | Nagase et al. | |
| 2012/0069642 A1 | 3/2012 | Ueda et al. | |
| 2012/0074511 A1 | 3/2012 | Takahashi et al. | |
| 2012/0088125 A1 | 4/2012 | Nishiyama et al. | |
| 2013/0161768 A1* | 6/2013 | Khvalkovskiy et al. | 257/421 |

OTHER PUBLICATIONS

U.S. Appl. No. 61/875,577; Masahiko Nakayama; "Magnetoresistive Element and Method Thereof"; Sep. 9, 2013.

* cited by examiner

*Primary Examiner* — Evan Pert
*Assistant Examiner* — Changhyun Yi
(74) *Attorney, Agent, or Firm* — Holtz, Holtz & Volek PC

(57) ABSTRACT

According to one embodiment, a magnetoresistance effect element includes a reference layer, a shift canceling layer, a storage layer provided between the reference layer and the shift canceling layer, a tunnel barrier layer provided between the reference layer and the storage layer, and a spacer layer provided between the shift canceling layer and the storage layer, wherein a pattern of the storage layer is provided inside a pattern of the shift canceling layer when the patterns of the storage layer and the shift canceling layer are viewed from a direction perpendicular to the patterns of the storage layer and the shift canceling layer.

5 Claims, 5 Drawing Sheets

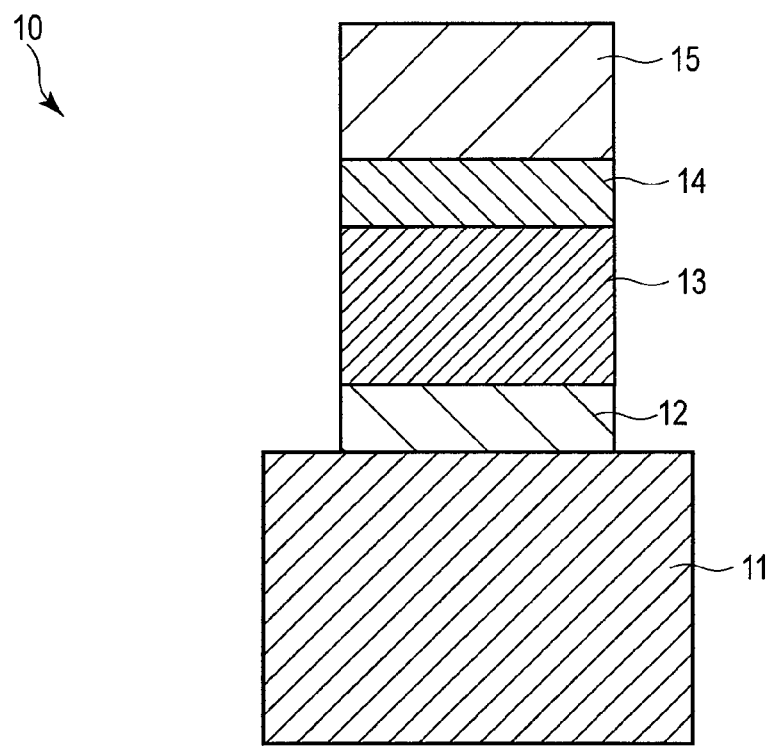
F I G. 1
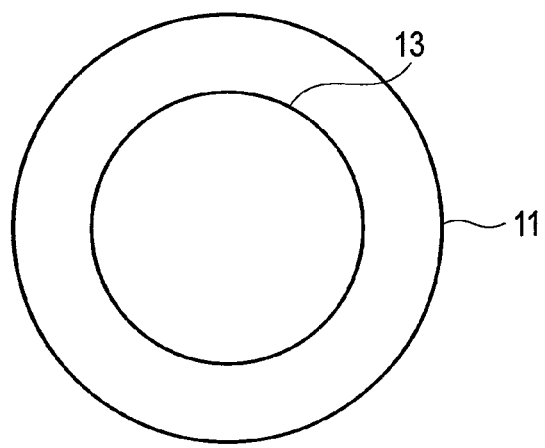
F I G. 2

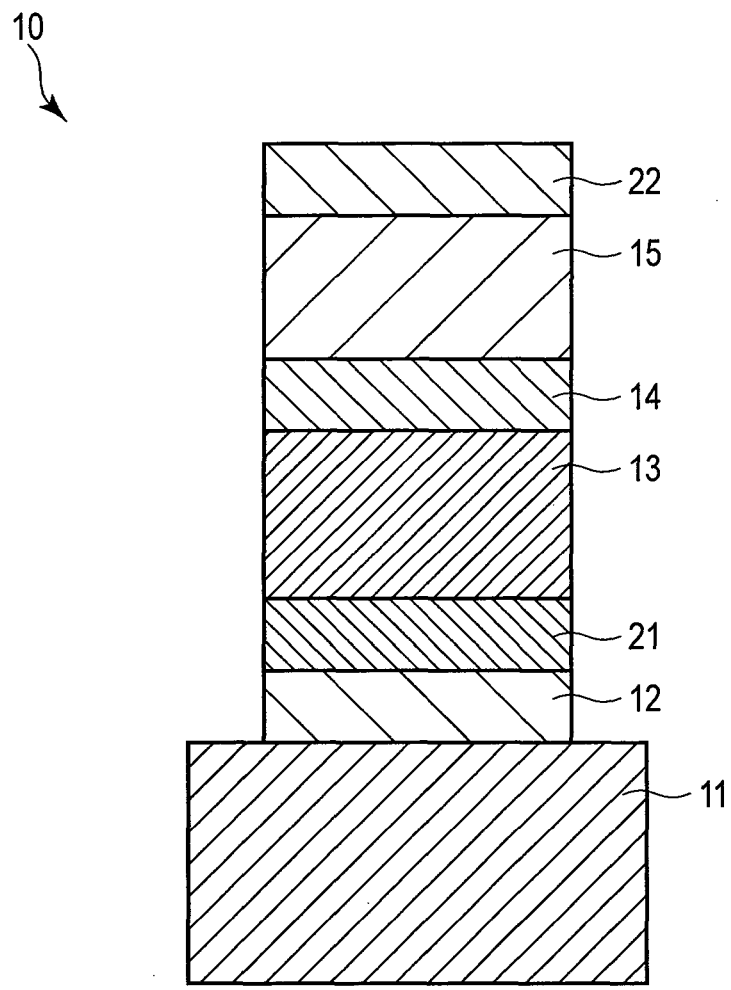
F I G. 9

MAGNETORESISTANCE EFFECT ELEMENT WITH SHIFT CANCELING LAYER HAVING PATTERN AREA GREATER THAN THAT OF STORAGE LAYER

CROSS-REFERENCE TO RELATED APPLICATIONS

This application claims the benefit of U.S. Provisional Application No. 61/804,407, filed Mar. 22, 2013, the entire contents of which are incorporated herein by reference.

FIELD

Embodiments described herein relate generally to a magnetoresistance effect element.

BACKGROUND

A magnetoresistance effect element for use in magnetic storage devices usually includes a storage layer, a tunnel barrier layer formed on the storage layer, a reference layer formed on the tunnel barrier layer and a shift canceling layer formed on the reference layer.

As the magnetoresistance effect element decreases in size, a shift magnetic field which is generated from the reference layer and affects the storage layer increases. Unless the shift canceling layer is thickened, shift canceling cannot be fully performed, thereby causing a problem in which the magnetoresistance effect element cannot stably be operated.

The decrease in size of the magnetoresistance effect element also causes a problem in which the magnetoresistance effect element is difficult to fabricate unless the entire element is thinned.

It is thus desirable to provide a magnetoresistance effect element capable of fully canceling a magnetic filed that affects a storage layer and decreasing in thickness.

BRIEF DESCRIPTION OF THE DRAWINGS

FIG. 1 is a schematic sectional view of a structure according to a first embodiment;

FIG. 2 is a schematic plan view of the structure according to the first embodiment;

FIG. 9 is a schematic sectional view of a structure of a modification to the second embodiment.

DETAILED DESCRIPTION

Figure 3:
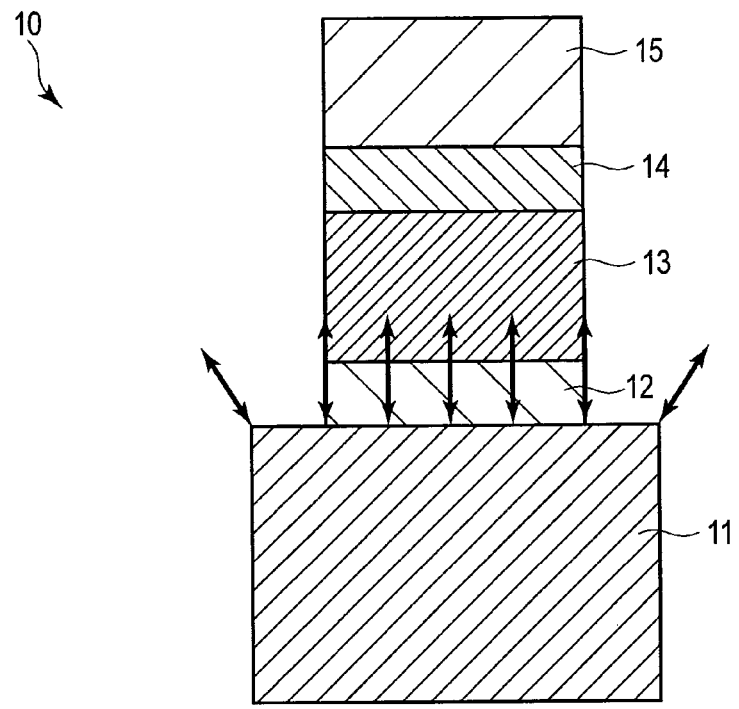
FIG. 3 is a diagram for illustrating the advantage of the first embodiment.

In general, according to one embodiment, a magnetoresistance effect element includes: a reference layer; a shift canceling layer; a storage layer provided between the reference layer and the shift canceling layer; a tunnel barrier layer provided between the reference layer and the storage layer; and a spacer layer provided between the shift canceling layer and the storage layer, wherein a pattern of the storage layer is provided inside a pattern of the shift canceling layer when the patterns of the storage layer and the shift canceling layer are viewed from a direction perpendicular to the patterns of the storage layer and the shift canceling layer.

(First Embodiment)

FIG. 1 is a schematic sectional view of a structure of a magnetoresistance effect element according to a first embodiment. FIG. 2 is a schematic plan view of the structure of the magnetoresistance effect element according to the first embodiment.

FIGS. 1 and 2 show a magnetoresistance effect element 10. The element 10 includes a reference layer 15, a shift canceling layer 11, a storage layer 13 formed between the reference layer 15 and the shift canceling layer 11, a tunnel barrier layer 14 formed between the reference layer 15 and the storage layer 13 and a spacer layer 12 formed between the shift canceling layer 11 and the storage layer 13. In other words, the magnetoresistance effect element 10 has a stacked structure in which the shift canceling layer 11, spacer layer 12, storage layer 13, tunnel barrier layer 14 and reference layer 15 are stacked one on another in that order presented. Though not shown, for example, a semiconductor substrate and a transistor are provided below a region in which the magnetoresistance effect element 10 is formed.

In the magnetoresistance effect element 10, the pattern of the storage layer 13 is formed inside the pattern of the shift canceling layer 11 when the patterns of the storage layer 13 and the shift canceling layer 11 are viewed from the direction perpendicular to the patterns of the storage layer 13 and the shift canceling layer 11.

Since the storage layer 13 is formed between the reference layer 15 and the shift canceling layer 11 as described above, a magnetic filed is applied to the storage layer 13 from both sides. The distance between the storage layer 13 and the reference layer 15 can be set equal to the distance between the storage layer 13 and the shift canceling layer 11. Thus, a magnetic field applied to the storage layer 13 from the reference layer 15 and a magnetic field applied to the storage layer 13 from the shift canceling layer 11 can be set equal to each other, without increasing the shift canceling layer 11 in thickness. Accordingly, the magnetoresistance effect element 10 can be decreased in its total thickness and its fabrication can be simplified. Therefore, the magnetoresistance effect element 10 according to the first embodiment brings about significant advantages that its total thickness can be decreased and a magnetic field applied to the storage layer can be fully canceled.

Since the pattern of the storage layer 13 is formed inside the pattern of the shift canceling layer 11, the magnetoresistance effect element 10 also brings about a significant advantage that a magnetic field can stably be applied to the storage layer 13. A further explanation will be given below.

If the side faces of the shift canceling layer 11, spacer layer 12, storage layer 13, tunnel barrier layer 14 and reference layer 15 are aligned in the vertical direction (or the side faces of these layers are flush with one another in the vertical direction), a nonuniform magnetic field is easily generated at an edge portion (a side face) of the storage layer 13 by, for example, application of a magnetic field having an oblique-direction component, which is generated from an edge of the shift canceling layer 11. As a result, a uniform reversal behavior of magnetization of the storage layer is inhibited and spin injection efficiency is degraded, thus making it difficult to achieve a magnetoresistance effect element having a significant advantage.

Since, in the first embodiment, the pattern of the storage layer 13 is formed inside the pattern of the shift canceling layer 11, the side face of the shift canceling layer 11 is located outside that of the storage layer 13. Thus, the magnetoresistance effect element 10 brings about a significant advantage of reducing non-uniform magnetic fields at the edge portion of the storage layer 13, which are due to, for example, application of oblique-direction magnetic fields, as indicated by arrows (showing the directions of the magnetic fields) in FIG. 3.

Figure 4:
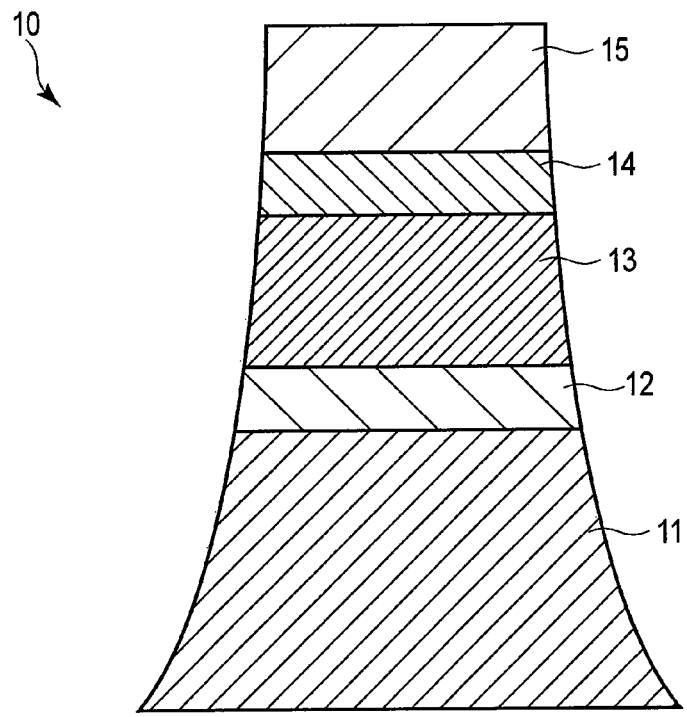
FIG. 4 is a schematic sectional view of a structure of a first modification to the first embodiment.

FIG. 4 is a schematic sectional view of a structure of a magnetoresistance effect element 10 according to a first modification to the first embodiment.

As shown in FIG. 4, the magnetoresistance effect element 10 has a stacked structure of a shift canceling layer 11, a spacer layer 12, a storage layer 13, a tunnel barrier layer 14 and a reference layer 15. An area of a cross-section of the stacked structure in a direction vertical to a stack direction of the stacked structure decreases toward the reference layer 15 from the shift canceling layer 11. In other words, the stacked structure is tapered.

The structure of the first modification can also bring about the same advantages as those of the above first embodiment.

Figure 5:
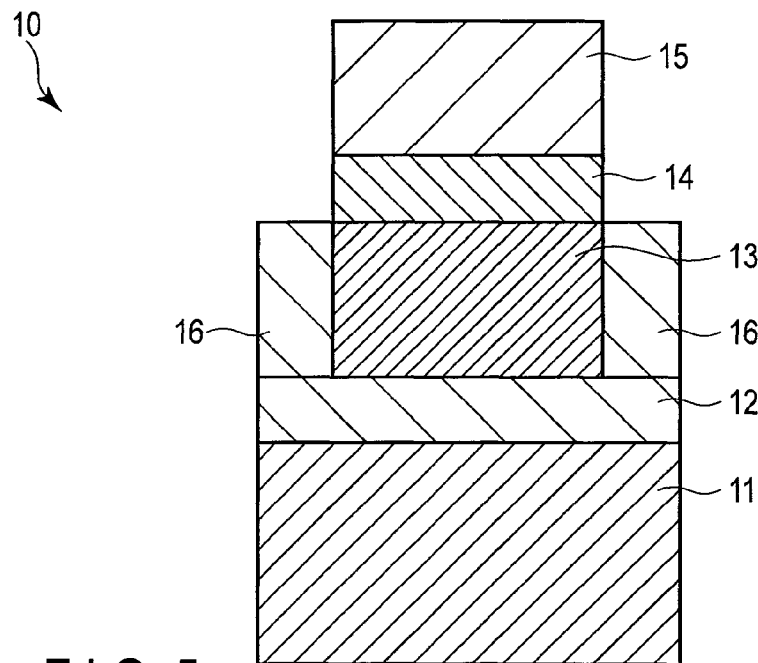
FIG. 5 is a schematic sectional view of a structure of a second modification to the first embodiment.

FIG. 5 is a schematic sectional view of a structure of a magnetoresistance effect element 10 according to a second modification to the first embodiment.

In the second modification, an amorphous demagnetized portion 16 is formed on the side of a storage layer 13. The amorphous demagnetized portion 16 is formed by introducing a given element into the material of the storage layer 13. More specifically, the amorphous demagnetized portion 16 is formed by introducing a given element into the side of the storage layer 13, which is formed outside the patterns of the tunnel barrier layer 14 and the reference layer 15, in the stacked structure of the shift canceling layer 11, spacer layer 12, storage layer 13, tunnel barrier layer 14 and reference layer 15. The given element can be introduced by ion implantation and plasma doping. As the given element, for example, phosphorous (P), arsenic (As), antimony (Sb), boron (B), carbon (C), germanium (Ge) and oxygen (O) can be used.

The structure of the second modification can also bring about the same advantages as those of the above first embodiment, because the demagnetized portion 16 hardly magnetically has any influence upon the other layers.

Figure 6:
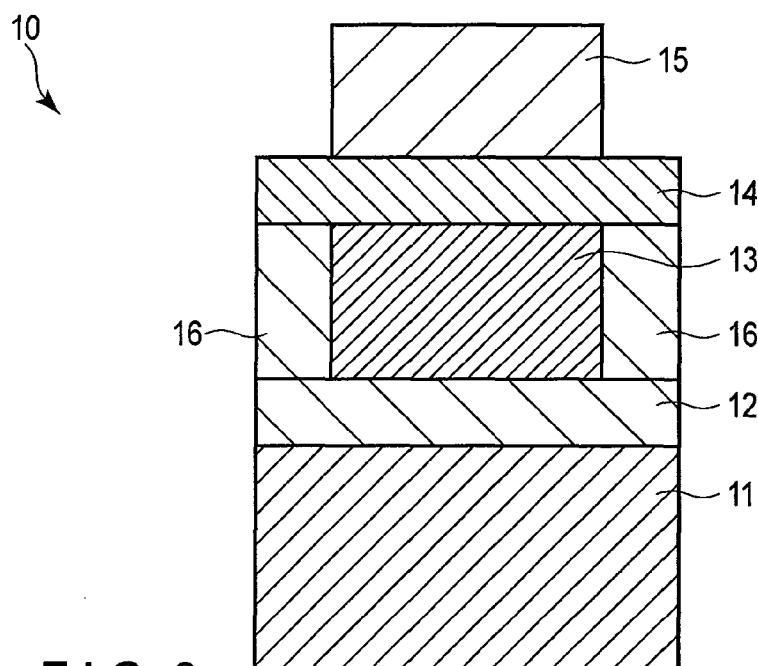
FIG. 6 is a schematic sectional view of a structure of a third modification to the first embodiment.

FIG. 6 is a schematic sectional view of a structure of a magnetoresistance effect element 10 according to a third modification to the first embodiment.

As in the second modification, in the third modification, too, a demagnetized portion 16 is provided on the side of a storage layer 13. However, the side of the demagnetized portion 16 is aligned with the side of a tunnel barrier layer 14.

The structure of the third modification can also bring about the same advantages as those of the above first embodiment.

Figure 7:
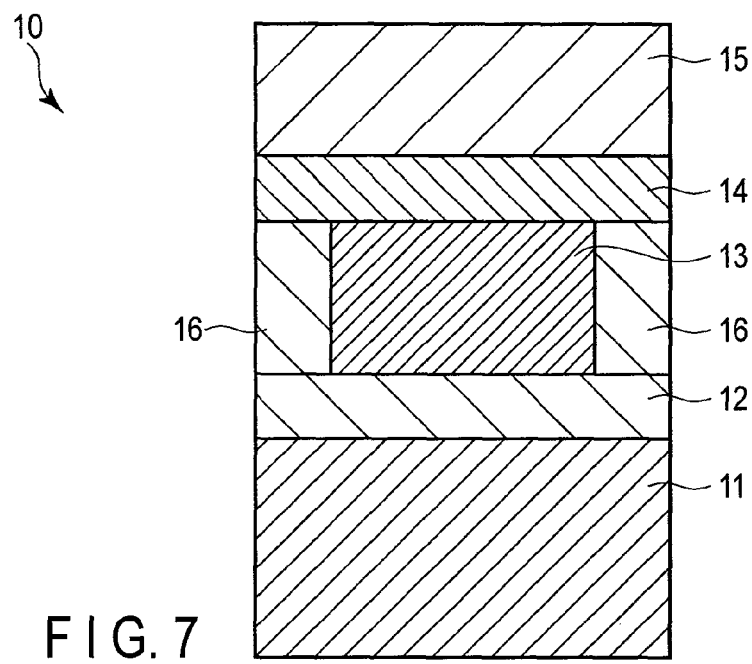
FIG. 7 is a schematic sectional view of a structure of a fourth modification to the first embodiment.

FIG. 7 is a schematic sectional view of a structure of a magnetoresistance effect element 10 according to a fourth modification to the first embodiment.

As in the second modification, in the fourth modification, too, a demagnetized portion 16 is provided on the side of a storage layer 13. However, the side of the demagnetized portion 16 is aligned with the side of a tunnel barrier layer 14 and that of a reference layer 15. The storage layer 13 can be formed by implanting ions obliquely, for example.

The structure according to the fourth modification can also bring about the same advantages as those of the above first embodiment.

(Second Embodiment)

Figure 8:
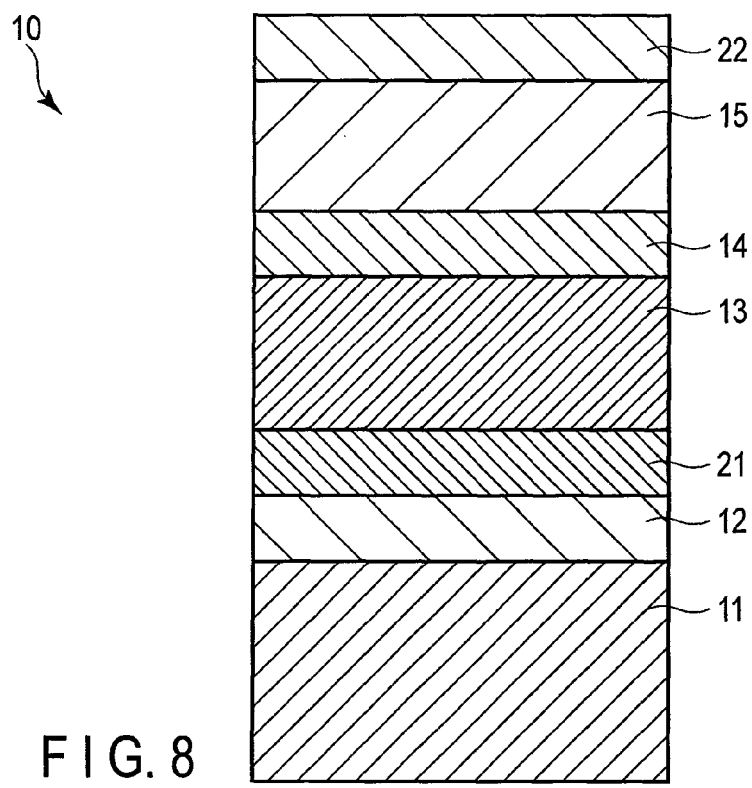
FIG. 8 is a schematic sectional view of a structure according to a second embodiment.

FIG. 8 is a schematic sectional view of a structure of a magnetoresistance effect element 10 according to a second embodiment. The same matter as described with respect to the first embodiment is omitted because the structure of the magnetoresistance effect element according to the second embodiment is basically similar to that of the magnetoresistance effect element according to the first embodiment.

In the second embodiment, the magnetoresistance effect element 10 includes a shift canceling layer 11, and the layer 11 contains a first element which is a magnetic element and a second element having an orbital angular momentum that is greater than that of the first element. Cobalt (Co) can be used as the first element and platinum (Pt) or a rare-earth element can be used as the second element. As the rare-earth element, there are terbium (Tb), holmium (Ho), dysprosium (Dy) and so on.

The magnetoresistance effect element 10 according to the second embodiment also includes a diffusion preventing layer 21. The layer 21 is formed between a spacer layer 12 and a storage layer 13 to prevent the second element contained in the shift canceling layer 11 from being diffused into the storage layer 13. In the second embodiment, a cap layer 22 is formed on a reference layer 15.

The diffusion preventing layer 21 includes a very thin oxide layer (NOL: nano oxide layer). In other words, spinel ferrite and wustite can be used as the diffusion preventing layer 21. It is desirable that the diffusion preventing layer 21 should have an oriented fcc (111) face or an oriented hcp (0002) face. It is also desirable that the diffusion preventing layer 21 should have a function of preventing element such as copper (Cu) and silver (Ag) contained in the spacer layer 12 from being diffused into the storage layer 13.

It is desirable that the storage layer 13 should be formed of a material (e.g., CoPd) having magnetic crystal anisotropy such as an L11 structure or a material having magnetic interface anisotropy such as a CFB (CoFeB)/oxide.

In the second embodiment, too, the storage layer 13 is formed between the reference layer 15 and the shift canceling layer 11 as in the first embodiment. Therefore, the total thickness of the magnetoresistance effect element 10 can be decreased and a magnetic field applied to the storage layer can be fully canceled, as in the first embodiment, with the result that the magnetoresistance effect element 10 can bring about a significant advantage.

In the second embodiment, since the shift canceling layer 11 contains a first element which is a magnetic element and a second element having an orbital angular momentum that is greater than that of the first element, the storage layer 13 can be increased in magnetic perpendicular anisotropy, with the result that the magnetoresistance effect element 10 can bring about a significant advantage.

In the second embodiment, the diffusion preventing layer 21 is formed between the storage layer 13 and the spacer layer 12. Thus, the second element such as platinum (Pt) and a rare-earth element, which is contained in the shift canceling layer 11 and the element such as copper (Cu) and silver (Ag), which is contained in the spacer layer 12, can effectively be prevented from being diffused into the storage layer 13. In this regard, too, the magnetoresistance effect element 10 can bring about a significant advantage.

The diffusion preventing layer 21 has a function of serving as au underlying layer of the storage layer 13 to improve the magnetic perpendicular anisotropy of the layer 13. In this regard, too, the magnetoresistance effect element 10 can bring about a significant advantage.

Furthermore, the diffusion preventing layer 21 has a specular effect to allow a great spin torque to be exerted on the storage layer 13. In this regard, too, the magnetoresistance effect element 10 can bring about a significant advantage.

As shown in FIG. 9, the structure of the second embodiment can be combined with that of the first embodiment. The structure of the second embodiment can also be combined with that of each of the modifications to the first embodiment.

In the second embodiment, the shift canceling layer 11, spacer layer 12, diffusion preventing layer 21, storage layer 13, tunnel barrier layer 14 and reference layer 15 are stacked one on another toward the top layer from the bottom layer (substrate side) in that order presented. In the reverse order, the reference layer 15, tunnel barrier layer 14, storage layer 13, diffusion preventing layer 21, spacer layer 12 and shift canceling layer 11 can be stacked one on another toward the top layer from the bottom layer (substrate side) and, in this case, an area of the cross-section of the stacked structure in the direction vertical to the stack direction may decrease toward the top layer from the bottom layer (substrate side), or the stacked structure can be tapered.

Each of above described MTJ structures can be introduced as MTJ elements of memory cells. Memory cells, Memory cell arrays, and memory devices is described in U.S. patent application Ser. No. 13/420,106, Asao, the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistance effect element comprising:
a reference layer;
a shift canceling layer;
a storage layer provided between the reference layer and the shift canceling layer;
a tunnel barrier layer provided between the reference layer and the storage layer; and
a spacer layer provided between the shift canceling layer and the storage layer, wherein the spacer layer is formed of a material different from that of the tunnel barrier layer,
wherein a pattern of the storage layer is provided inside a pattern of the shift canceling layer when the patterns of the storage layer and the shift canceling layer are viewed from a direction perpendicular to the patterns of the storage layer and the shift canceling layer.

2. The element of claim 1, wherein the shift canceling layer, the spacer layer, the storage layer, the tunnel barrier layer and the reference layer are stacked one on another in that order to have a stacked structure.

3. The element of claim 2, wherein an area of a cross-section of the stacked structure in a direction vertical to a stack direction of the stacked structure decreases toward the reference layer from the shift canceling layer.

4. The element of claim 1, further comprising a demagnetized portion provided on a side of the storage layer.

5. The element of claim 4, wherein the demagnetized portion is an amorphous demagnetized portion.

* * * * *